(12) United States Patent
Chung (10) Patent No.: US 8,008,099 B2
(45) Date of Patent: Aug. 30, 2011

(54) LED PACKAGE STRUCTURE WITH CONCAVE AREA FOR POSITIONING HEAT-CONDUCTING SUBSTANCE AND METHOD FOR MANUFACTURING THE SAME

(75) Inventor: Chia-Tin Chung, Miaoli County (TW)

(73) Assignee: Paragon Semiconductor Lighting Technology Co., Ltd., Taoyuan County (TW)

( * ) Notice: Subject to any disclaimer, the term of this patent is extended or adjusted under 35 U.S.C. 154(b) by 111 days.

(21) Appl. No.: 12/558,492

(22) Filed: Sep. 12, 2009

(65) Prior Publication Data

US 2011/0006318 A1    Jan. 13, 2011

(30) Foreign Application Priority Data

Jul. 8, 2009   (TW) .............................. 98123046 A (51) Int. Cl.
*H01L 21/00*   (2006.01)
(52) U.S. Cl. ................ 438/22; 438/24; 438/26
(58) Field of Classification Search ............. 438/22–28, 438/E33.059, E33.067
See application file for complete search history.

(56) References Cited

U.S. PATENT DOCUMENTS 6,514,782 B1 * 2/2003 Wierer et al. ............... 438/22
2009/0302344 A1 * 12/2009 Inoguchi ..................... 257/98

* cited by examiner

*Primary Examiner* — Cuong Q Nguyen
(74) *Attorney, Agent, or Firm* — Pai Patent & Trademark Law Firm; Chao-Chang David Pai (57) ABSTRACT

An LED package structure with concave area for positioning heat-conducting substance includes a substrate unit, a heat-conducting adhesive unit, a light-emitting unit, a conductive unit and a package unit. The substrate unit has a substrate body, a concave space formed on the substrate body, and a plurality of positive and negative pads exposed on the substrate body. The heat-conducting adhesive unit has a heat-conducting adhesive layer positioned in the concave space. The light-emitting unit has a plurality of LED chips disposed on the heat-conducting adhesive layer and received in the concave space. The conductive unit has a plurality of wires. Each LED chip is electrically connected between each positive pad and each negative pad. The package unit has a translucent package resin body disposed on the substrate body in order to cover the LED chips and the wires.

4 Claims, 14 Drawing Sheets

LED PACKAGE STRUCTURE WITH CONCAVE AREA FOR POSITIONING HEAT-CONDUCTING SUBSTANCE AND METHOD FOR MANUFACTURING THE SAME

BACKGROUND OF THE INVENTION

1. Field of the Invention

The present invention relates to an LED package structure and a method for manufacturing the same, in particular, to an LED package structure with concave area for positioning heat-conducting substance and a method for manufacturing the same.

2. Description of Related Art

The invention of the lamp greatly changed the style of building construction and the living style of human beings, allowing people to work during the night. Without the invention of the lamp, we may stay in the living conditions of ancient civilizations.

Various lamps such as incandescent bulbs, fluorescent bulbs, power-saving bulbs and etc. have been intensively used for indoor illumination. These lamps commonly have the disadvantages of quick attenuation, high power consumption, high heat generation, short working life, high fragility, and being not recyclable. Further, the rapid flow of electrons (about 120 per second) through the electrodes of a regular fluorescent bulb causes an unstable current at the onset of lighting a fluorescent bulb, resulting in a flash of light that is harmful to the sight of the eyes. In order to eliminate this problem, a high frequency electronic ballast may be used. When a fluorescent or power-saving bulb is used with high frequency electronic ballast, it saves about 20% of the consumption of power and eliminates the problem of flashing. However, the high frequency electronic ballast is not detachable when installed in a fluorescent or power-saving bulb, the whole lamp assembly becomes useless if the bulb is damaged. Furthermore, because a fluorescent bulb contains a mercury coating, it may cause pollution to the environment when thrown away after damage. Hence, LED lamp or LED tube is created in order to solve the above-mentioned questions of the prior lamp.

SUMMARY OF THE INVENTION

In view of the aforementioned issues, the present invention provides an LED package structure with concave area for positioning heat-conducting substance and a method for manufacturing the same. The present invention uses at least one concave space on a substrate body to position LED (Light-emitting Diode) chips and uses at least one heat-conducting adhesive layer to efficiently dissipate heat generated by the LED chips.

To achieve the above-mentioned objectives, the present invention provides an LED package structure with concave area for positioning heat-conducting substance, including: a substrate unit, a heat-conducting adhesive unit, a light-emitting unit, a conductive unit and a package unit. The substrate unit has a substrate body, at least one concave space formed on a top surface of the substrate body, a plurality of positive pads exposed on the top surface of the substrate body and a plurality of negative pads exposed on the top surface of the substrate body. The heat-conducting adhesive unit has at least one heat-conducting adhesive layer positioned in the at least one concave space of the substrate unit. The light-emitting unit has a plurality of LED chips disposed on the heat-conducting adhesive layer and received in the at least one concave space. Each LED chip has a positive electrode and a negative electrode. The conductive unit has a plurality of wires. Every two wires are respectively electrically connected between the positive electrode of each LED chip and each positive pad and between the negative electrode of each LED chip and each negative pad. The package unit has a translucent package resin body disposed on the top surface of the substrate body in order to cover the LED chips and the wires.

To achieve the above-mentioned objectives, the present invention provides an LED package structure with concave area for positioning heat-conducting substance, including: a substrate unit, a heat-conducting adhesive unit, a light-emitting unit, a conductive unit and a package unit. The substrate unit has a substrate body, a plurality of concave spaces formed on a top surface of the substrate body, a plurality of positive pads exposed on the top surface of the substrate body and a plurality of negative pads exposed on the top surface of the substrate body. The heat-conducting adhesive unit has a plurality of heat-conducting adhesive layers respectively positioned in the concave spaces of the substrate unit. The light-emitting unit has a plurality of LED chips respectively disposed on the heat-conducting adhesive layers and respectively received in the concave spaces, and each LED chip has a positive electrode and a negative electrode. The conductive unit has a plurality of wires. Every two wires are respectively electrically connected between the positive electrode of each LED chip and each positive pad and between the negative electrode of each LED chip and each negative pad. The package unit has a translucent package resin body disposed on the top surface of the substrate body in order to cover the LED chips and the wires.

To achieve the above-mentioned objectives, the present invention provides a method for manufacturing an LED package structure with concave area for positioning heat-conducting substance, including: providing a substrate unit that has a substrate body, at least one concave space formed on a top surface of the substrate body, a plurality of positive pads exposed on the top surface of the substrate body and a plurality of negative pads exposed on the top surface of the substrate body; placing a plurality of heat-conducting adhesive balls in the at least one concave space; placing a plurality of LED chips on the heat-conducting adhesive balls, and each LED chip having a positive electrode and a negative electrode; transforming the heat-conducting adhesive balls into a heat-conducting adhesive layer by a reflow process in order to fix the LED chips in the at least one concave space of the substrate unit; electrically connecting each LED chip between each positive pad and each negative pad by a plurality of wires, and every two wires respectively electrically connected between the positive electrode of each LED chip and each positive pad and between the negative electrode of each LED chip and each negative pad; and then forming a translucent package resin body on the top surface of the substrate body in order to cover the LED chips and the wires.

Therefore, the present invention creates one or many concave spaces to receive one or many heat-conducting adhesive layers (such as solder ball or solder paste) and LED chips on the heat-conducting adhesive layers. Hence, the present invention can use the at least one concave space on the substrate body to position LED chips and use the at least one heat-conducting adhesive layer to efficiently dissipate heat generated by the LED chips.

In order to further understand the techniques, means and effects the present invention takes for achieving the prescribed objectives, the following detailed descriptions and appended drawings are hereby referred, such that, through which, the purposes, features and aspects of the present invention can be thoroughly and concretely appreciated; however, the appended drawings are merely provided for reference and illustration, without any intention to be used for limiting the present invention.

DETAILED DESCRIPTION OF THE PREFERRED EMBODIMENTS

Figure 1:
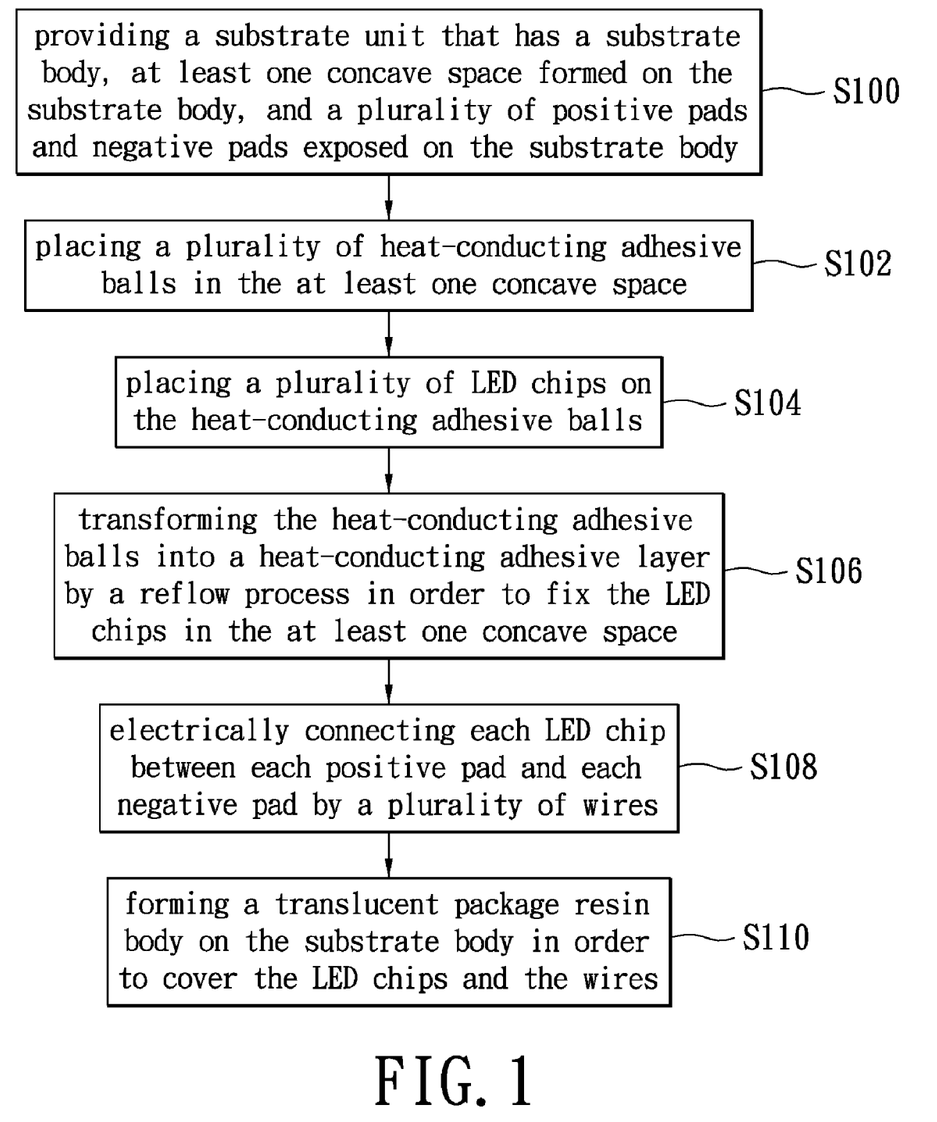
FIG. 1 is a flowchart of the method of manufacturing an LED package structure according to the first embodiment of the present invention.

Referring to FIG. 1, the first embodiment of the present invention provides a method for manufacturing an LED package structure with concave area for positioning heat-conducting substance. The method includes: providing a substrate unit (wherein the substrate unit has a substrate body, at least one concave space formed on a top surface of the substrate body, a plurality of positive pads exposed on the top surface of the substrate body and a plurality of negative pads exposed on the top surface of the substrate body); placing a plurality of heat-conducting adhesive balls (or heat-conducting adhesive paste) in the at least one concave space; placing a plurality of LED chips on the heat-conducting adhesive balls (wherein each LED chip has a positive electrode and a negative electrode); transforming the heat-conducting adhesive balls into a heat-conducting adhesive layer by a reflow process in order to fix the LED chips in the at least one concave space of the substrate unit; electrically connecting each LED chip between each positive pad and each negative pad by a plurality of wires (wherein every two wires are respectively electrically connected between the positive electrode of each LED chip and each positive pad and between the negative electrode of each LED chip and each negative pad); and then forming a translucent package resin body on the top surface of the substrate body in order to cover the LED chips and the wires.

Figure 1A:
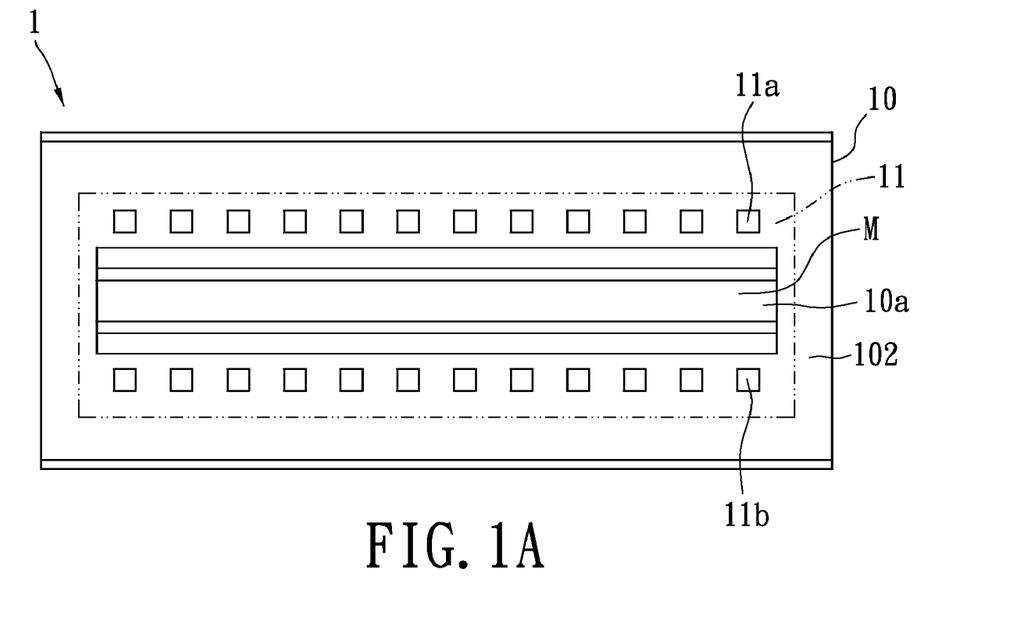
FIGS. 1A to 1J are schematic views of the LED package structure according to the first embodiment of the present invention, at different stages of the packaging processes, respectively.
Figure 1B:
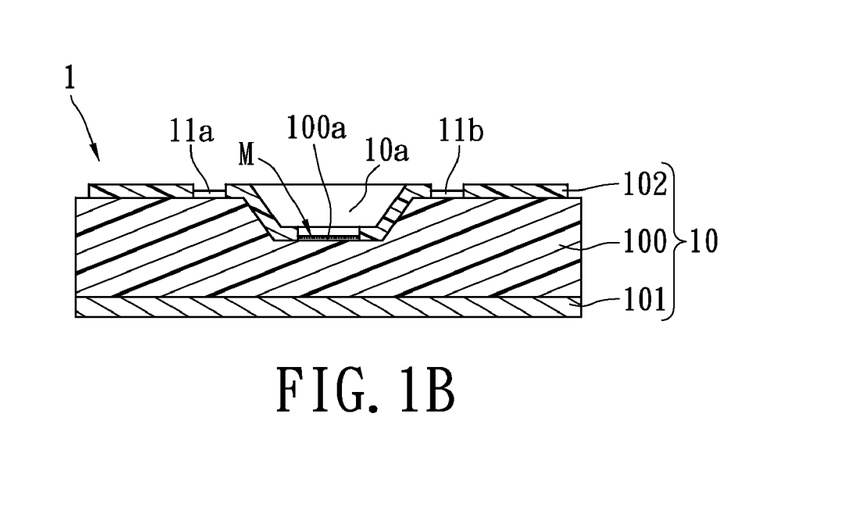

Referring to FIGS. 1 and 1A-1K, the detail descriptions of the first embodiment of the present invention are shown as follows:

Referring to FIGS. 1, 1A and 1B (FIG. 1B is a lateral, cross-sectional view of FIG. 1A), the method includes providing a substrate unit 1 that has a substrate body 10, at least one concave space 10a formed on a top surface of the substrate body 10, a plurality of positive pads 11a exposed on the top surface of the substrate body 10 and a plurality of negative pads 11b exposed on the top surface of the substrate body 10 (the step of S100). In the first embodiment, the at least one concave space 10a can be a ladder-type groove, and the substrate unit 1 has a chip-placing area 11 disposed on the top surface of the substrate body 10.

Moreover, the substrate body 10 has a circuit substrate 100, a heat-dissipating layer 101 disposed on a bottom surface of the circuit substrate 100 and an insulative reflecting layer 102 disposed on the top surface of the circuit substrate 100 in order to expose the positive pads 11a, the negative pads 11b and one part of a bottom surface 100a in the concave space 10a. In addition, a Ni/Pd/Au alloy M is disposed on the bottom surface 100a. Hence, the heat-dissipating efficiency of the circuit substrate 100 is increased by using the heat-dissipating layer 101, and the insulative reflecting layer 102 is a solder mask for exposing the positive pads 11a and the negative pads 11b only in order to achieve local soldering. However, the above-mentioned definition of the substrate body 10 does not limit the present invention. Any types of substrate can be applied to the present invention. For example, the substrate body 10 can be a PCB (Printed Circuit Board), a flexible substrate, an aluminum substrate, a ceramic substrate, or a copper substrate.

Figure 1C:
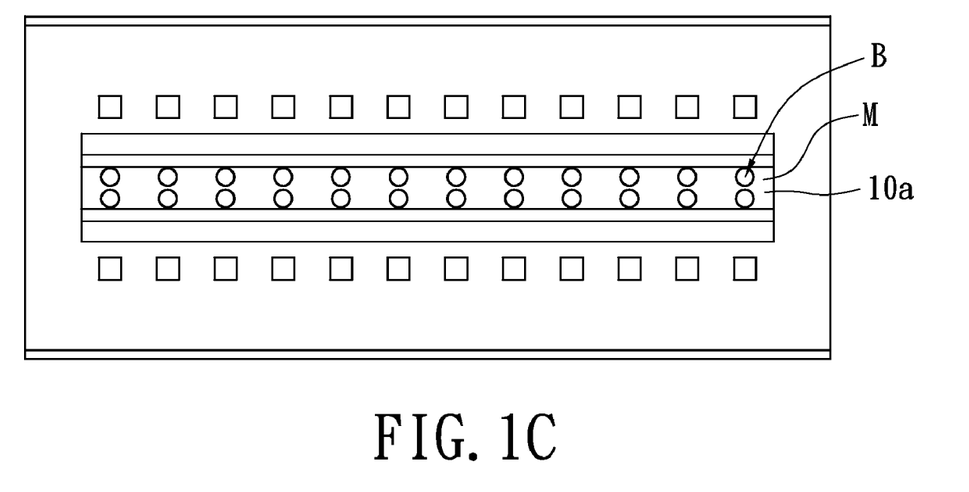
Figure 1D:
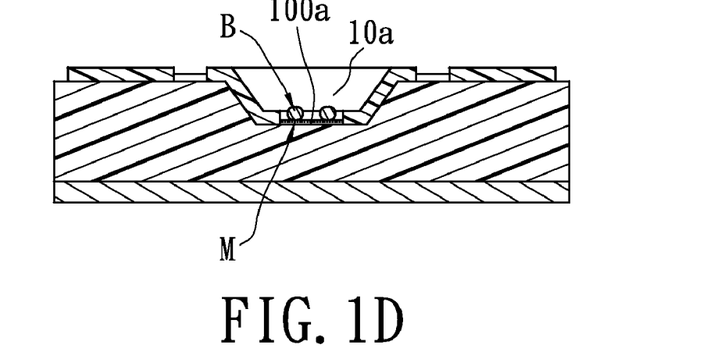

Referring to FIGS. 1, 1C and 1D (FIG. 1D is a lateral, cross-sectional view of FIG. 1C), the method includes placing a plurality of heat-conducting adhesive balls (or heat-conducting adhesive paste) B in the at least one concave space 10a (the step of S102). In other words, the heat-conducting adhesive balls (or the heat-conducting adhesive paste) B are disposed in the at least one concave space 10a and on the bottom surface 100a, and each heat-conducting adhesive ball B can be a solder ball or solder paste.

Figure 1E:
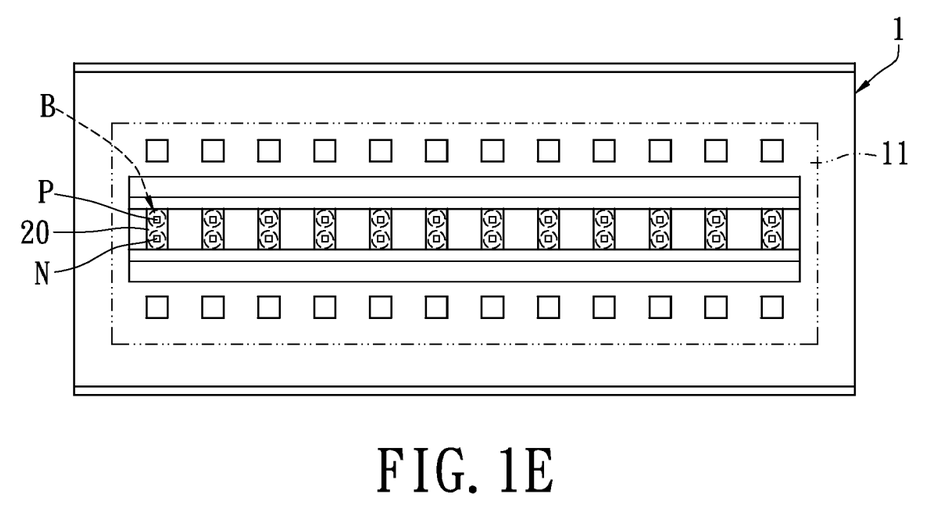
Figure 1F:
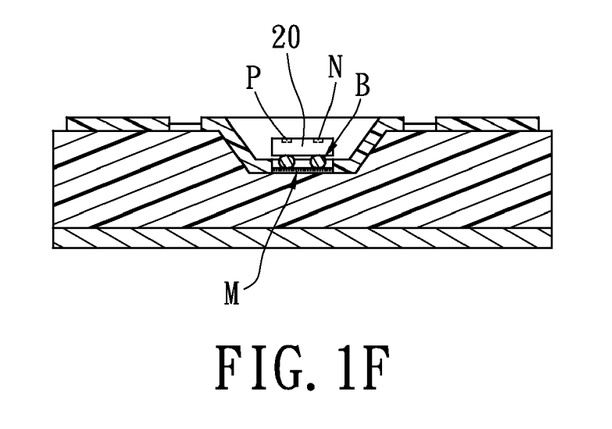

Referring to FIGS. 1, 1E and 1F (FIG. 1F is a lateral, cross-sectional view of FIG. 1E), the method includes placing a plurality of LED chips 20 on the heat-conducting adhesive balls B; wherein each LED chip 20 has a positive electrode P and a negative electrode N (the step of S104). In addition, the LED chips 20 are electrically disposed on the chip-placing area 11 of the substrate unit 1.

Figure 1G:
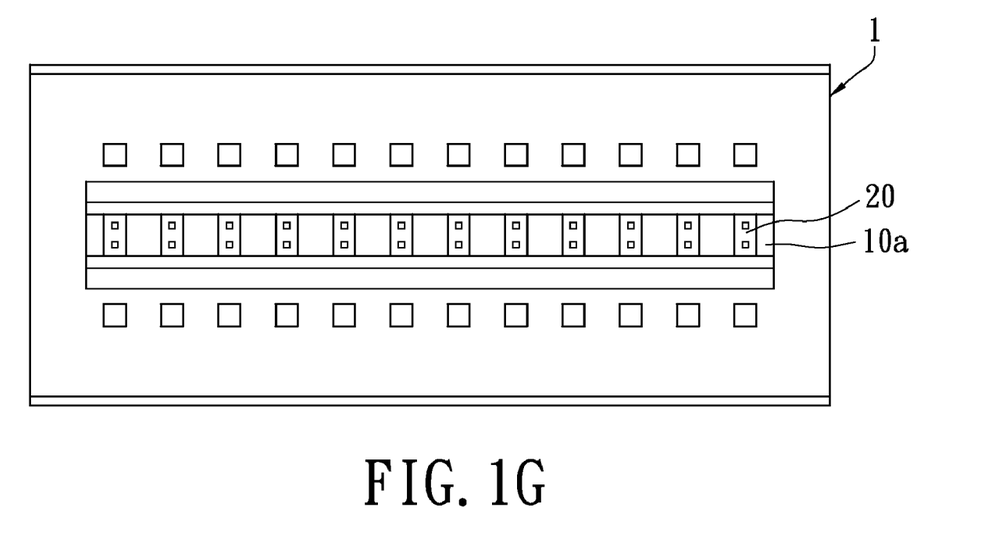
Figure 1H:
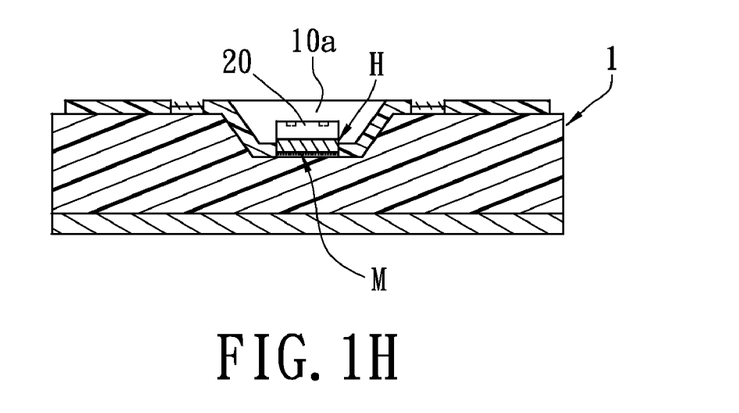

Referring to FIGS. 1, 1G and 1H (FIG. 1H is a lateral, cross-sectional view of FIG. 1G), the method includes transforming the heat-conducting adhesive balls B into a heat-conducting adhesive layer H by a reflow process in order to fix the LED chips 20 in the at least one concave space 10a of the substrate unit 1 (the step of S106). In addition, the heat-conducting adhesive layer H is formed on the Ni/Pd/Au alloy M, so that the heat-conducting adhesive layer H does not directly touch the substrate body 10.

Figure 1I:
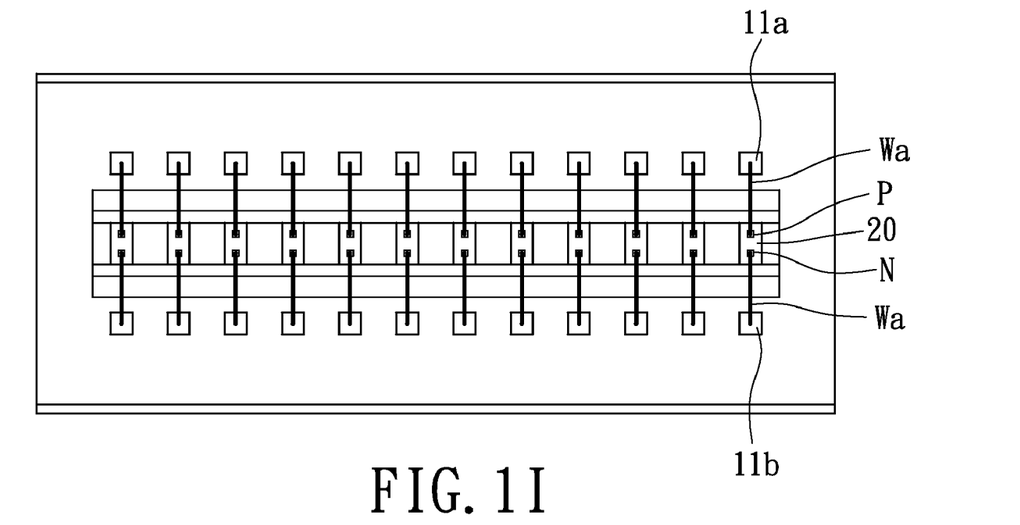
Figure 1J:
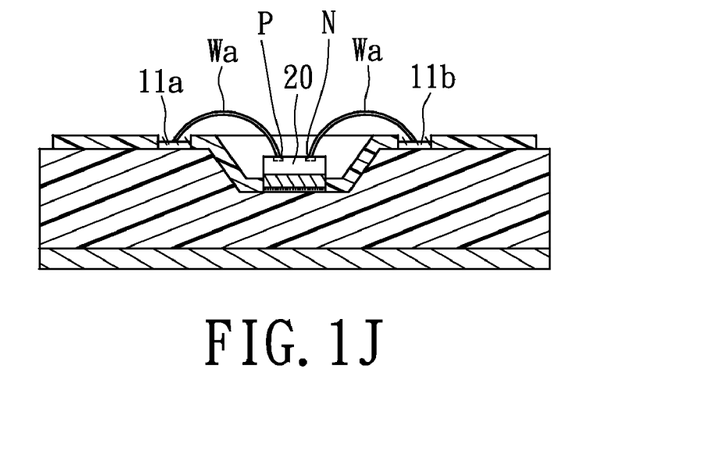

Referring to FIGS. 1, 1I and 1J (FIG. 1J is a lateral, cross-sectional view of FIG. 1I), the method includes electrically connecting each LED chip 20 between each positive pad 11a and each negative pad 11b by a plurality of wires Wa; wherein every two wires Wa are respectively electrically connected between the positive electrode P of each LED chip 20 and each positive pad 11a and between the negative electrode N of each LED chip 20 and each negative pad 11b (the step of S108).

Figure 1K:
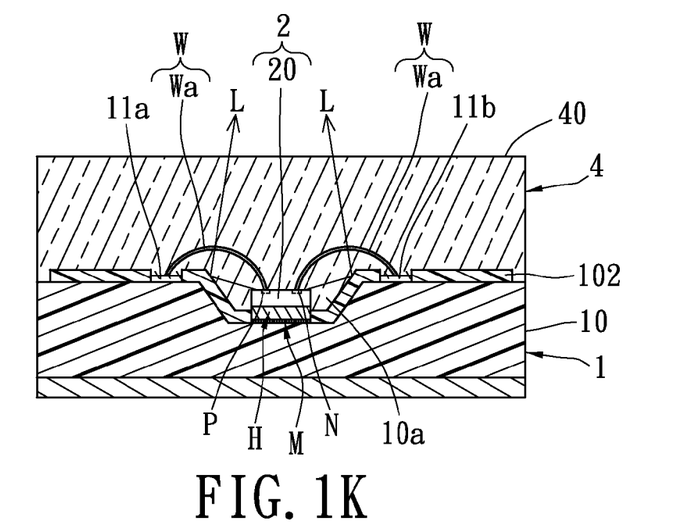
FIG. 1K is a cross-sectional, schematic view of the LED package structure according to the first embodiment of the present invention.

Referring to FIGS. 1 and 1K, the method includes forming a translucent package resin body 40 on the top surface of the substrate body 10 in order to cover the LED chips 20 and the wires Wa (the step of S110).

In the first embodiment, each LED chip 20 can be a blue LED chip, and the translucent package resin body 40 can be a phosphor body. Hence, blue light beams (not shown) generated by the LED chips 20 (the blue LED chips) can pass through the translucent package resin body 40 (the phosphor body) or can be reflected by the insulative reflecting layer 102 to generate white light beams L that are similar to the light source generate by sun lamp.

Hence, referring to FIG. 1K, the first embodiment of the present invention provides an LED package structure with concave area for positioning heat-conducting substance, including: a substrate unit 1, a heat-conducting adhesive unit, a light-emitting unit 2, a conductive unit W and a package unit 4.

Moreover, the substrate unit 1 has a substrate body 10, at least one concave space 10a formed on a top surface of the substrate body 10, a plurality of positive pads 11a exposed on the top surface of the substrate body 10 and a plurality of negative pads 11b exposed on the top surface of the substrate body 10. In addition, the heat-conducting adhesive unit has at least one heat-conducting adhesive layer H positioned in the at least one concave space 10a of the substrate unit 1. The heat-conducting adhesive layer H is a heat-conducting coating layer made of a plurality of solder balls or solder paste that have passed through a tin furnace (as shown in FIGS. 1F and 1H). Furthermore, the light-emitting unit 2 has a plurality of LED chips 20 disposed on the heat-conducting adhesive layer H and received in the at least one concave space 10a, and each LED chip 20 has a positive electrode P and a negative electrode N.

In addition, the conductive unit W has a plurality of wires Wa. Every two wires Wa are respectively electrically connected between the positive electrode P of each LED chip 20 and each positive pad 11a and between the negative electrode N of each LED chip 20 and each negative pad 11b. In other words, the positive electrode P and the negative electrode N of each LED chip 20 are respectively electrically connected each positive pad 11a and each negative pad 11b by every two wires Wa. Moreover, the package unit 4 has a translucent package resin body 40 disposed on the top surface of the substrate body 10 in order to cover the LED chips 20 and the wires Wa.

Furthermore, the LED package structure of the first embodiment further includes: a Ni/Pd/Au alloy M disposed between the substrate body 10 and the heat-conducting adhesive layer M, and the LED chips 20 are disposed over the Ni/Pd/Au alloy M by the heat-conducting adhesive layer H.

Figure 2:
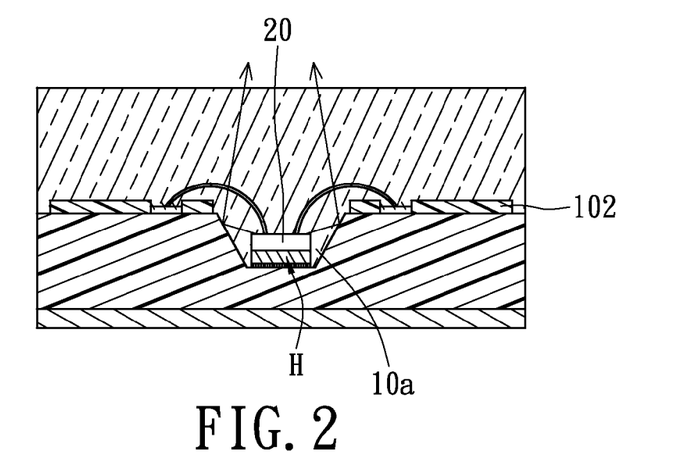
FIG. 2 is a cross-sectional, schematic view of the LED package structure according to the second embodiment of the present invention.

Referring to FIG. 2, the difference between the second embodiment and the first embodiment is that: in the second embodiment, the insulative reflecting layer 102 does not form in the concave space 10a. Hence, the heat-conducting adhesive layer H and the LED chips 20 can be positioned on the bottom side in the concave space 10a.

Figure 3:
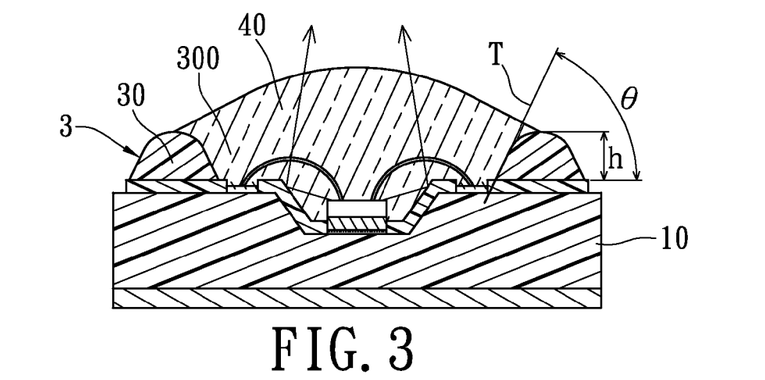
FIG. 3 is a cross-sectional, schematic view of the LED package structure according to the third embodiment of the present invention.

Referring to FIG. 3, the difference between the third embodiment and the above-mentioned embodiments is that: in the third embodiment, before the step of forming the translucent package resin body 10, an annular reflecting resin body 30 (a light-reflecting unit 3) is formed on the top surface of the substrate body 10.

For example, the light-reflecting unit 3 that has an annular reflecting resin body 30 surroundingly formed on the top surface of the substrate body 10 by coating. The annular reflecting resin body 30 surrounds the LED chips 20 on the chip-placing area 11 (such as shown in FIG. 1A) to form a resin position limiting space 300 above the substrate body 10, and the position of the translucent package resin body 40 is limited in the resin position limiting space 300. In addition, before the step of forming the translucent package resin body 40, the method includes: surroundingly coating liquid resin (not shown) on the top surface of the substrate body 10 (the liquid resin can be coated on the substrate body 10 by any shapes according to different requirements (such as a circular shape, a square or a rectangular shape etc.)), and then hardening the liquid resin to form an annular reflecting resin body 30, and the annular reflecting resin body 30 can be a white thermohardening reflecting body (opaque resin) mixed with inorganic additive.

The thixotropic index of the liquid resin is between 4 and 6, the pressure of coating the liquid resin on the top surface of the substrate body 10 is between 350 kpa and 450 kpa, and the velocity of coating the liquid resin on the top surface of the substrate body 10 is between 5 mm/s and 15 mm/s. The liquid resin is surroundingly coated on the top surface of the substrate body 10 from a start point to a termination point, and the position of the start point and the position of the termination point are the same. In addition, the liquid resin is hardened by baking, the baking temperature is between 120° C. and 140° C., and the baking time is between 20 minute and 40 minute.

Moreover, the annular reflecting resin body 30 has an arc shape formed on a top surface thereof. The annular reflecting resin body 30 has a radius tangent T, and the angle θ of the radius tangent T relative to the top surface of the substrate body 10 is between 40° C. and 50° C. The maximum height h of the annular reflecting resin body 30 relative to the top surface of the substrate body 10 is between 0.3 mm and 0.7 mm, and the width of a bottom side of the annular reflecting resin body 30 is between 1.5 mm and 3 mm. The thixotropic index of the annular reflecting resin body 30 is between 4 and 6.

Figure 4:
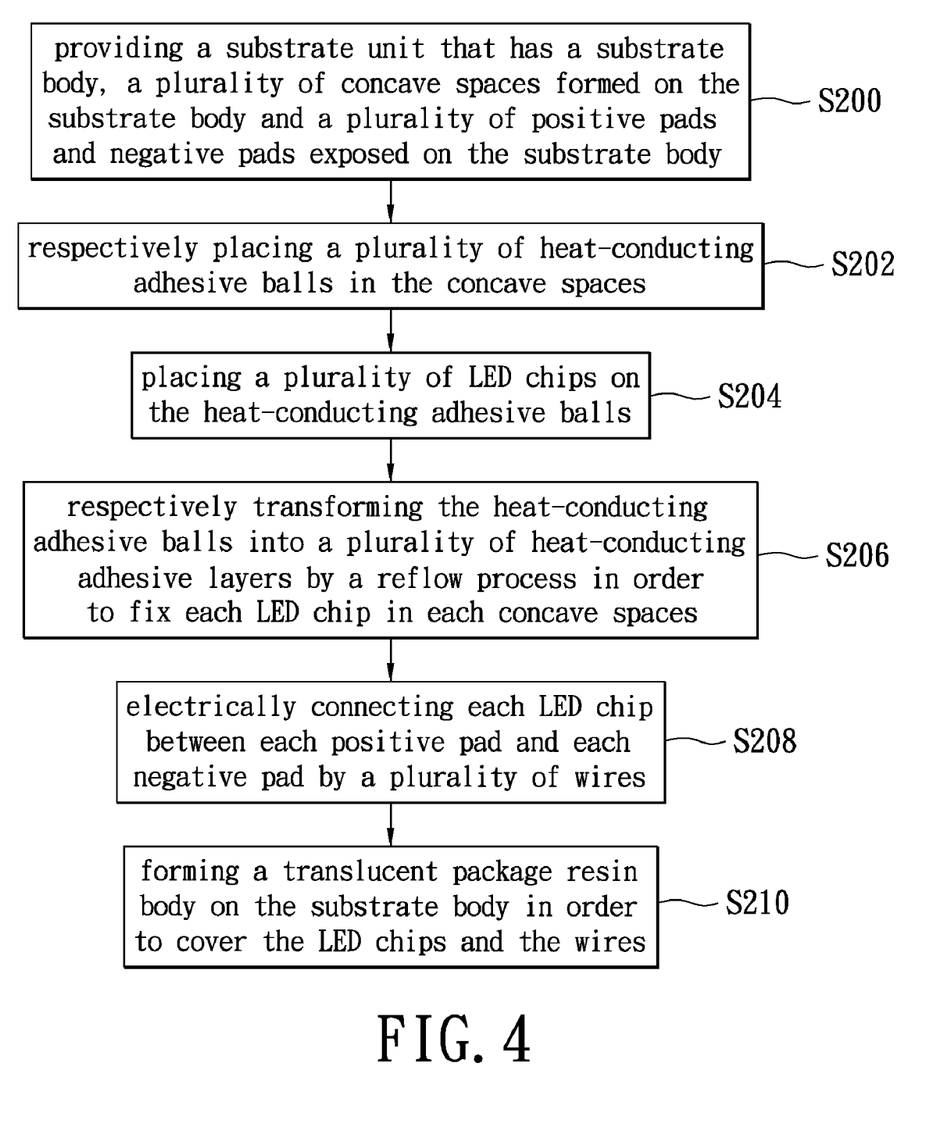
FIG. 4 is a flowchart of the method of manufacturing an LED package structure according to the fourth embodiment of the present invention.

Referring to FIG. 4, the second embodiment of the present invention provides a method for manufacturing an LED package structure with concave area for positioning heat-conducting substance. The method includes: providing a substrate unit (wherein the substrate unit has a substrate body, a plurality of concave spaces formed on a top surface of the substrate body, a plurality of positive pads exposed on the top surface of the substrate body and a plurality of negative pads exposed on the top surface of the substrate body); respectively placing a plurality of heat-conducting adhesive balls (or heat-conducting adhesive paste) in the concave spaces; placing a plurality of LED chips on the heat-conducting adhesive balls (wherein each LED chip has a positive electrode and a negative electrode); respectively transforming the heat-conducting adhesive balls into a plurality of heat-conducting adhesive layers by a reflow process in order to fix the LED chips in the concave spaces of the substrate unit; electrically connecting each LED chip between each positive pad and each negative pad by a plurality of wires (wherein every two wires are respectively electrically connected between the positive electrode of each LED chip and each positive pad and between the negative electrode of each LED chip and each negative pad); and then forming a translucent package resin body on the top surface of the substrate body in order to cover the LED chips and the wires.

Figure 4A:
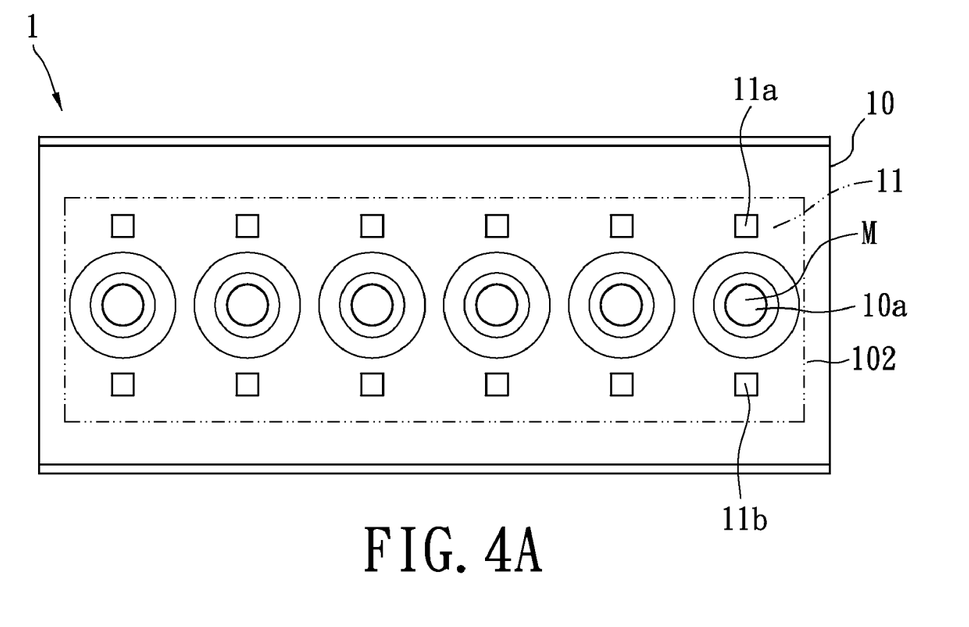
FIGS. 4A to 4J are schematic views of the LED package structure according to the fourth embodiment of the present invention, at different stages of the packaging processes, respectively.
Figure 4B:
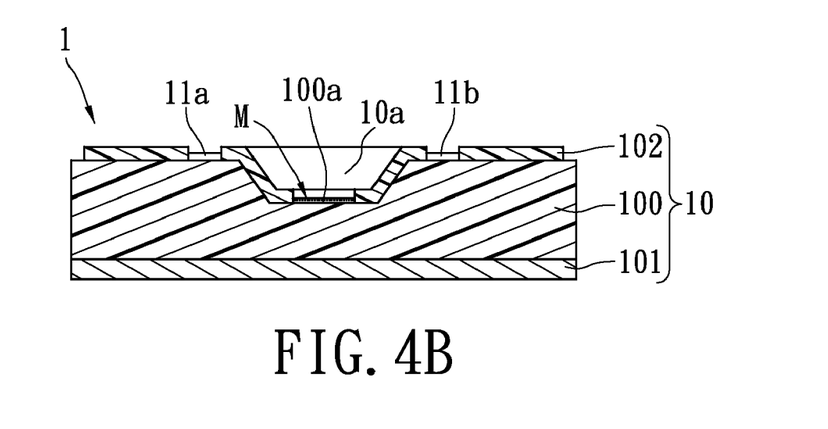

Referring to FIGS. 4 and 4A-4K, the detail descriptions of the second embodiment of the present invention are shown as follows:

Referring to FIGS. 1, 4A and 4B (FIG. 4B is a lateral, cross-sectional view of FIG. 4A), the method includes providing a substrate unit 1 that has a substrate body 10, a plurality of concave spaces 10a formed on a top surface of the substrate body 10, a plurality of positive pads 11a exposed on the top surface of the substrate body 10 and a plurality of negative pads 11b exposed on the top surface of the substrate body 10 (the step of S200). In the second embodiment, each concave space 10a can be a poculiform groove, and the substrate unit 1 has a chip-placing area 11 disposed on the top surface of the substrate body 10.

Moreover, the substrate body 10 has a circuit substrate 100, a heat-dissipating layer 101 disposed on a bottom surface of the circuit substrate 100 and an insulative reflecting layer 102 disposed on the top surface of the circuit substrate 100 in order to expose the positive pads 11a, the negative pads 11b and one part of bottom surfaces 100a in the concave spaces 10a. In addition, each Ni/Pd/Au alloy M is disposed on each bottom surface 100a.

Figure 4C:
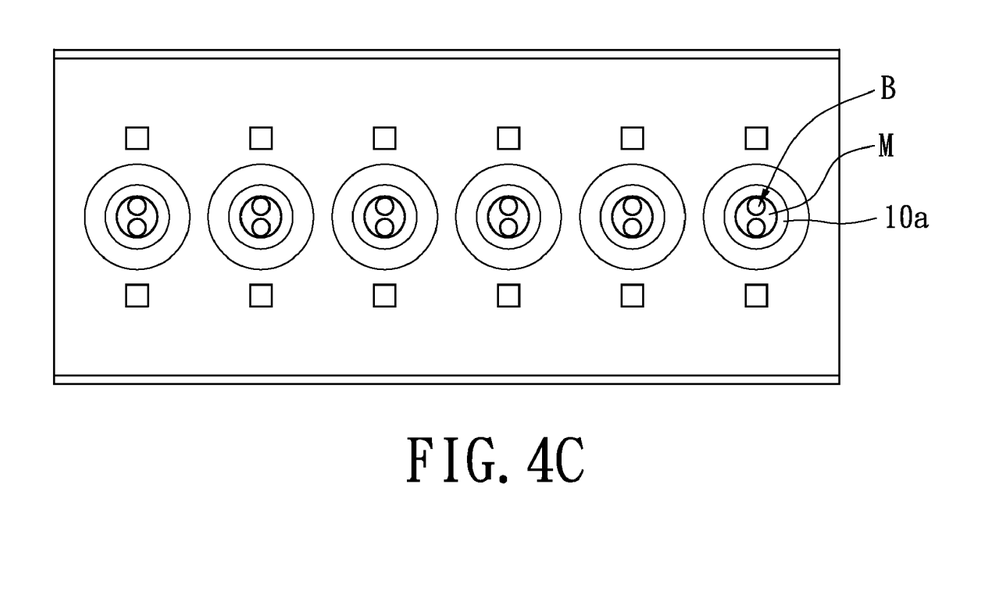
Figure 4D:
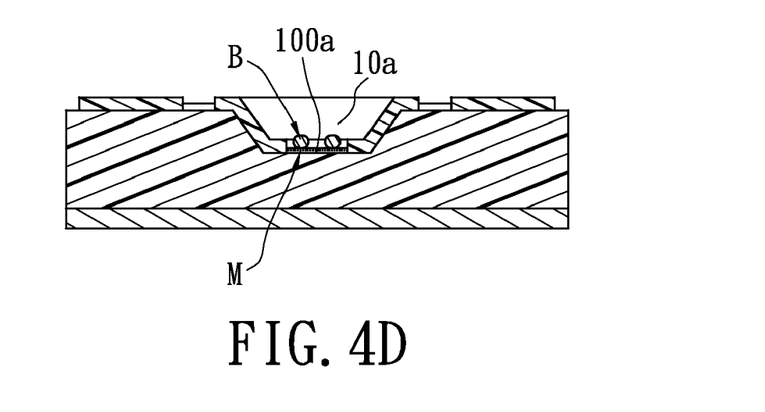

Referring to FIGS. 4, 4C and 4D (FIG. 4D is a lateral, cross-sectional view of FIG. 4C), the method includes respectively placing a plurality of heat-conducting adhesive balls (or heat-conducting adhesive paste) B in the concave spaces 10a (the step of S202). In other words, at least one heat-conducting adhesive ball (or the heat-conducting adhesive paste) B is disposed in each concave space 10a and on each bottom surface 100a, and each heat-conducting adhesive ball B can be a solder ball or solder paste.

Figure 4E:
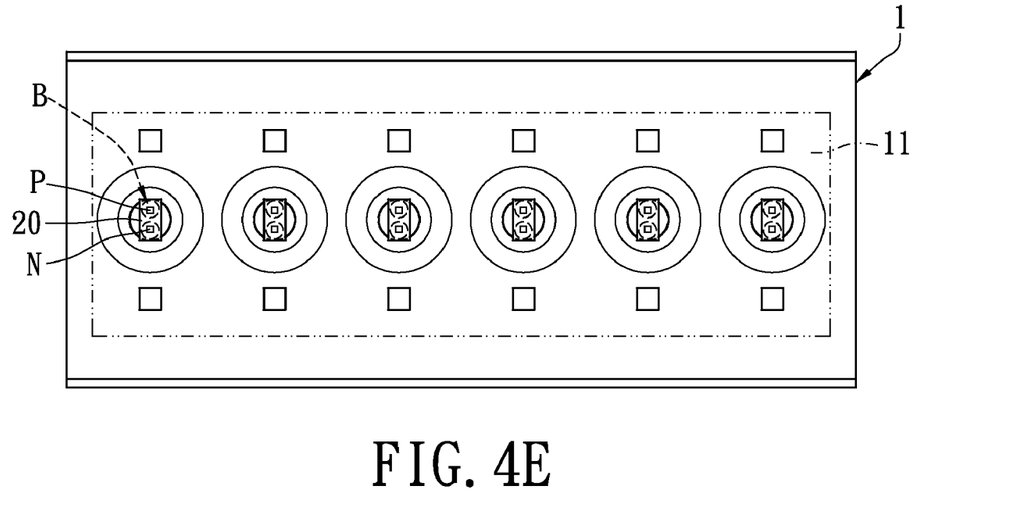
Figure 4F:
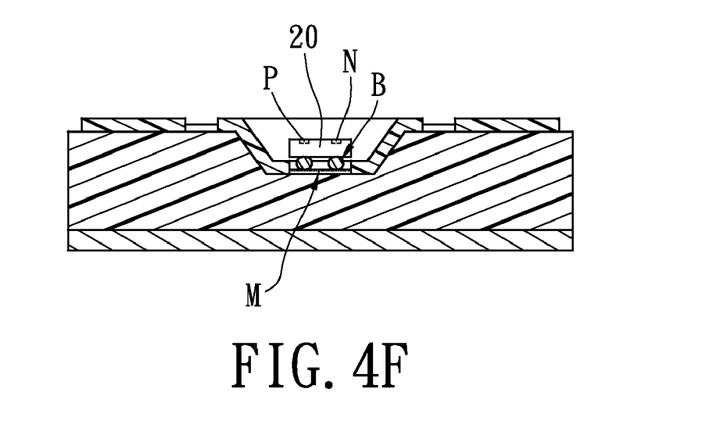

Referring to FIGS. 4, 4E and 4F (FIG. 4F is a lateral, cross-sectional view of FIG. 4E), the method includes placing a plurality of LED chips 20 on the heat-conducting adhesive balls B; wherein each LED chip 20 has a positive electrode P and a negative electrode N (the step of S204). In addition, the LED chips 20 are electrically disposed on the chip-placing area 11 of the substrate unit 1.

Figure 4G:
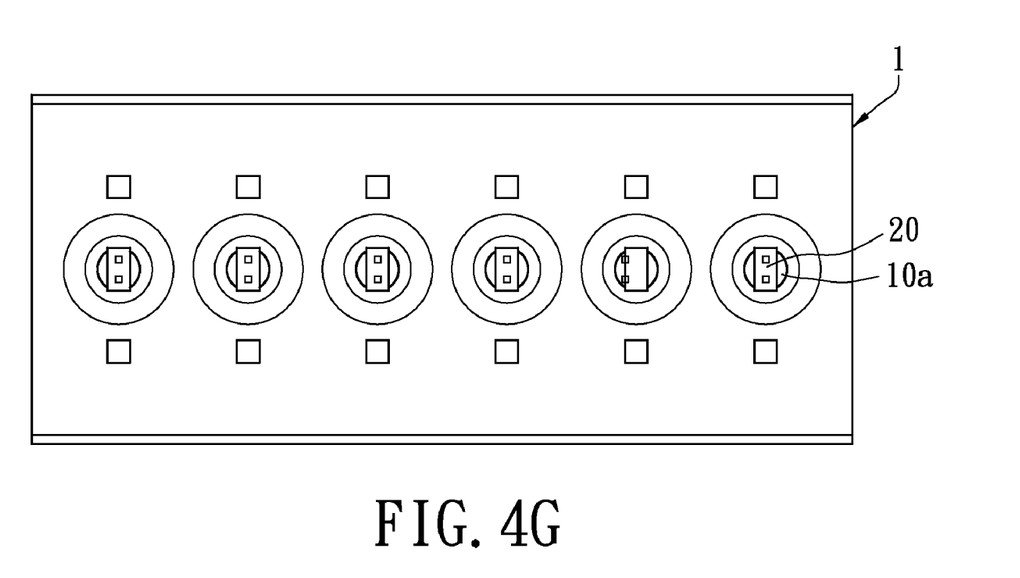
Figure 4H:
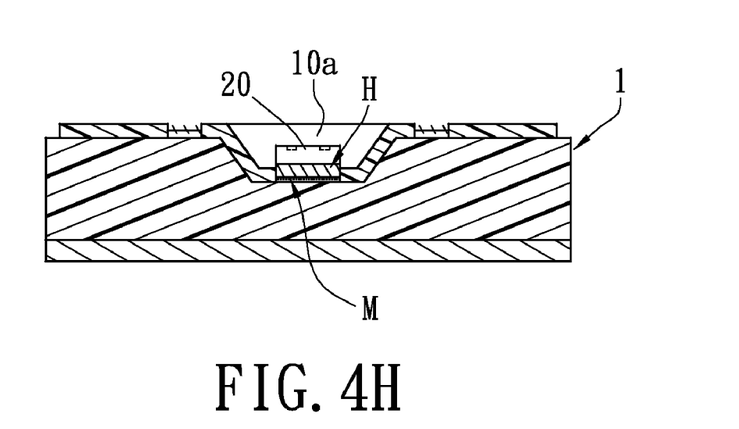

Referring to FIGS. 4, 4G and 4H (FIG. 4H is a lateral, cross-sectional view of FIG. 4G), the method includes respectively transforming the heat-conducting adhesive balls B into a plurality of heat-conducting adhesive layers H by a reflow process in order to fix each LED chip 20 in each concave spaces 10a of the substrate unit 1 (the step of S206). In addition, each heat-conducting adhesive layer H is formed on each Ni/Pd/Au alloy M, so that the heat-conducting adhesive layers H do not directly touch the substrate body 10.

Figure 4I:
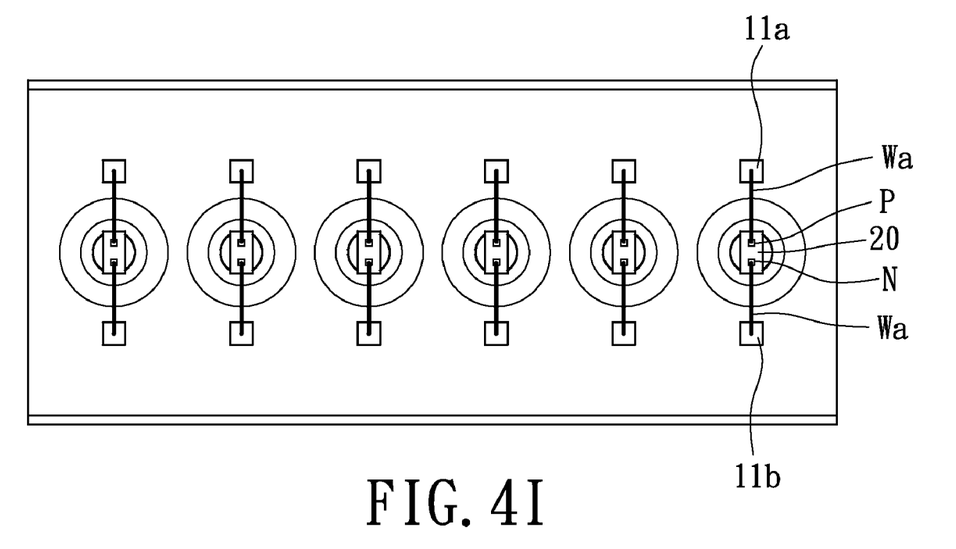
Figure 4J:
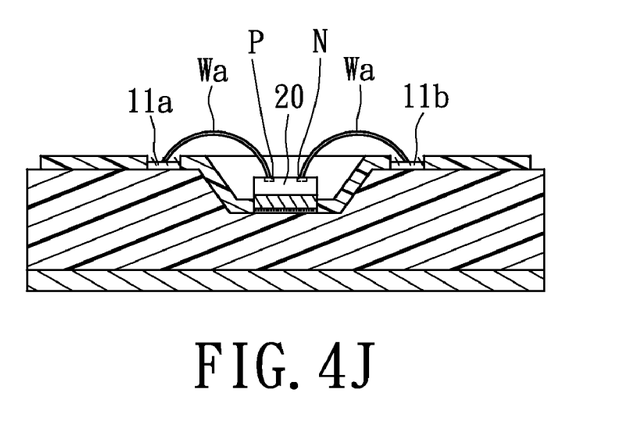

Referring to FIGS. 4, 4I and 4J (FIG. 4J is a lateral, cross-sectional view of FIG. 4I), the method includes electrically connecting each LED chip 20 between each positive pad 11a and each negative pad 11b by a plurality of wires Wa; wherein every two wires Wa are respectively electrically connected between the positive electrode P of each LED chip 20 and each positive pad 11a and between the negative electrode N of each LED chip 20 and each negative pad 11b (the step of S208).

Figure 4K:
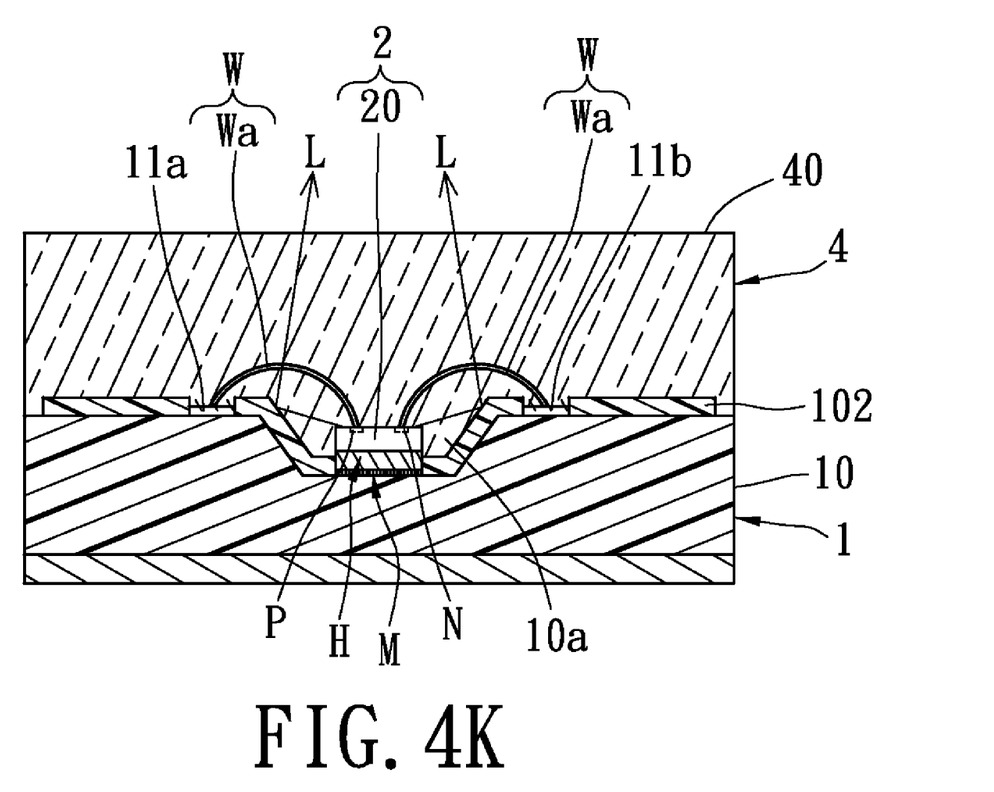
FIG. 4K is a cross-sectional, schematic view of the LED package structure according to the fourth embodiment of the present invention.

Referring to FIGS. 4 and 4K, the method includes forming a translucent package resin body 40 on the top surface of the substrate body 10 in order to cover the LED chips 20 and the wires Wa (the step of S210).

In the second embodiment, each LED chip 20 can be a blue LED chip, and the translucent package resin body 40 can be a phosphor body. Hence, blue light beams (not shown) generated by the LED chips 20 (the blue LED chips) can pass through the translucent package resin body 40 (the phosphor body) or can be reflected by the insulative reflecting layer 102 to generate white light beams L that are similar to the light source generate by sun lamp.

Hence, referring to FIG. 4K, the second embodiment of the present invention provides an LED package structure with concave area for positioning heat-conducting substance, including: a substrate unit 1, a heat-conducting adhesive unit, a light-emitting unit 2, a conductive unit W and a package unit 4.

Moreover, the substrate unit 1 has a substrate body 10, a plurality of least one concave spaces 10a formed on a top surface of the substrate body 10, a plurality of positive pads 11a exposed on the top surface of the substrate body 10 and a plurality of negative pads 11b exposed on the top surface of the substrate body 10. In addition, the heat-conducting adhesive unit has a plurality of heat-conducting adhesive layers H respectively positioned in the concave spaces 10a of the substrate unit 1. Each heat-conducting adhesive layer H is a heat-conducting coating layer made of a plurality of solder balls or solder paste that have passed through a tin furnace (as shown in FIGS. 4F and 4H). Furthermore, the light-emitting unit 2 has a plurality of LED chips 20 respectively disposed on the heat-conducting adhesive layers H and received in the concave spaces 10a, and each LED chip 20 has a positive electrode P and a negative electrode N.

In addition, the conductive unit W has a plurality of wires Wa. Every two wires Wa are respectively electrically connected between the positive electrode P of each LED chip 20 and each positive pad 11a and between the negative electrode N of each LED chip 20 and each negative pad 11b. In other words, the positive electrode P and the negative electrode N of each LED chip 20 are respectively electrically connected each positive pad 11a and each negative pad 11b by every two wires Wa. Moreover, the package unit 4 has a translucent package resin body 40 disposed on the top surface of the substrate body 10 in order to cover the LED chips 20 and the wires Wa.

Furthermore, the LED package structure of the first embodiment further includes: a plurality of Ni/Pd/Au alloys M. Each Ni/Pd/Au alloy M is disposed between the substrate body 10 and each heat-conducting adhesive layer M, and each LED chip 20 is disposed over each Ni/Pd/Au alloy M by each heat-conducting adhesive layer H.

In conclusion, the present invention creates one or many concave spaces to receive one or many heat-conducting adhesive layers (such as solder ball or solder paste) and LED chips on the heat-conducting adhesive layers. Hence, the present invention can use the at least one concave space on the substrate body to position LED chips and use the at least one heat-conducting adhesive layer to efficiently dissipate heat generated by the LED chips.

The above-mentioned descriptions represent merely the preferred embodiment of the present invention, without any intention to limit the scope of the present invention thereto. Various equivalent changes, alternations or modifications based on the claims of present invention are all consequently viewed as being embraced by the scope of the present invention.

What is claimed is:

1. A method for manufacturing an LED package structure with concave area for positioning heat-conducting substance, comprising:

providing a substrate unit, wherein the substrate unit has a substrate body, at least one concave space formed on a top surface of the substrate body, a plurality of positive pads exposed on the top surface of the substrate body and a plurality of negative pads exposed on the top surface of the substrate body;

placing a plurality of heat-conducting adhesive balls in the at least one concave space;

placing a plurality of LED chips on the heat-conducting adhesive balls, wherein each LED chip has a positive electrode and a negative electrode;

transforming the heat-conducting adhesive balls into a heat-conducting adhesive layer by a reflow process in order to fix the LED chips in the at least one concave space of the substrate unit;

electrically connecting each LED chip between each positive pad and each negative pad by a plurality of wires, wherein every two wires are respectively electrically connected between the positive electrode of each LED chip and each positive pad and between the negative electrode of each LED chip and each negative pad; and forming a translucent package resin body on the top surface of the substrate body in order to cover the LED chips and the wires.

2. The method according to claim 1, wherein before the step of forming the translucent package resin body, the method comprises: surroundingly coating liquid resin on the top surface of the substrate body, and then hardening the liquid resin to form an annular reflecting resin body, wherein the annular reflecting resin body surrounds the LED chips to form a resin position limiting space above the substrate body, and the position of the translucent package resin body is limited in the resin position limiting space.

3. The method according to claim 1, wherein each heat-conducting adhesive ball is a solder ball or solder paste, a Ni/Pd/Au alloy is disposed between the substrate body and the heat-conducting adhesive layer, and the LED chips are disposed over the Ni/Pd/Au alloy by the heat-conducting adhesive layer.

4. The method according to claim 1, wherein the at least one concave space is a ladder-type groove or is composed of a plurality of poculiform grooves.

* * * * *